United States Patent [19]

Huber et al.

[11] Patent Number: 4,490,771

[45] Date of Patent: Dec. 25, 1984

[54] CONTROL CIRCUIT ARRANGEMENT FOR AN ELECTROMAGNETICALLY OPERATED POWER TOOL

[75] Inventors: Siefried Huber, Johannesberg; Manfred Merkator, Wiesbaden, both of Fed. Rep. of Germany

[73] Assignee: Black & Decker Inc., Newark, Del.

[21] Appl. No.: 443,966

[22] Filed: Nov. 23, 1982

[30] Foreign Application Priority Data

Dec. 9, 1981 [GB] United Kingdom ............... 8137134

[51] Int. Cl.³ .......................................... H01H 47/32
[52] U.S. Cl. ..................... 361/154; 307/252 UA; 323/242; 323/244; 361/196; 361/205; 361/152
[58] Field of Search ............ 361/152, 153, 154, 186, 361/190, 196, 205; 307/252 UA, 252 N; 323/241, 242, 244; 363/128

[56] References Cited

U.S. PATENT DOCUMENTS

| | | | |
|---|---|---|---|
| 3,267,337 | 8/1966 | Doyle . | |
| 3,903,476 | 9/1975 | Gawron et al. | 307/252 N X |
| 3,950,657 | 4/1976 | Sheng et al. | 307/252 UA |
| 4,306,138 | 12/1981 | Tokunaga et al. | 323/244 X |

FOREIGN PATENT DOCUMENTS

| | | |
|---|---|---|
| 1120560 | 7/1968 | United Kingdom . |
| 1143687 | 2/1969 | United Kingdom . |
| 1209728 | 10/1970 | United Kingdom . |
| 1303827 | 1/1973 | United Kingdom . |
| 1358396 | 7/1974 | United Kingdom . |
| 1383086 | 2/1975 | United Kingdom . |
| 1476102 | 6/1977 | United Kingdom . |
| 2057206A | 3/1981 | United Kingdom . |

Primary Examiner—Reinhard J. Eisenzopf
Attorney, Agent, or Firm—Harold Weinstein; Edward D. Murphy; Ronald B. Sherer

[57] ABSTRACT

A control circuit arrangement for an electromagnetically operated power tool has a primary circuit including a solenoid and a semi-conductor switch, in series, the semi-conductor switch being capable of being triggered into a conducting state upon application of a trigger signal from a trigger control circuit. The trigger control circuit is actuated upon closure of a main trigger switch which is connected in series with the solenoid and the semi-conductor switch in the primary circuit for supplying current to the solenoid. Thus, should the semi-conductor switch fail due to a short-circuit, the power supply is disconnected from the solenoid the moment the operator releases the main trigger switch so protecting the solenoid. The semi-conductor switch is preferably a thyristor. An additional circuit is preferably provided for preventing the thyristor from firing a second time if the main switch remains closed. A delay circuit is also preferably provided for delaying firing of the thyristor until some time after the main switch has been closed to prevent arcing and damage to the main switch contacts.

4 Claims, 2 Drawing Figures

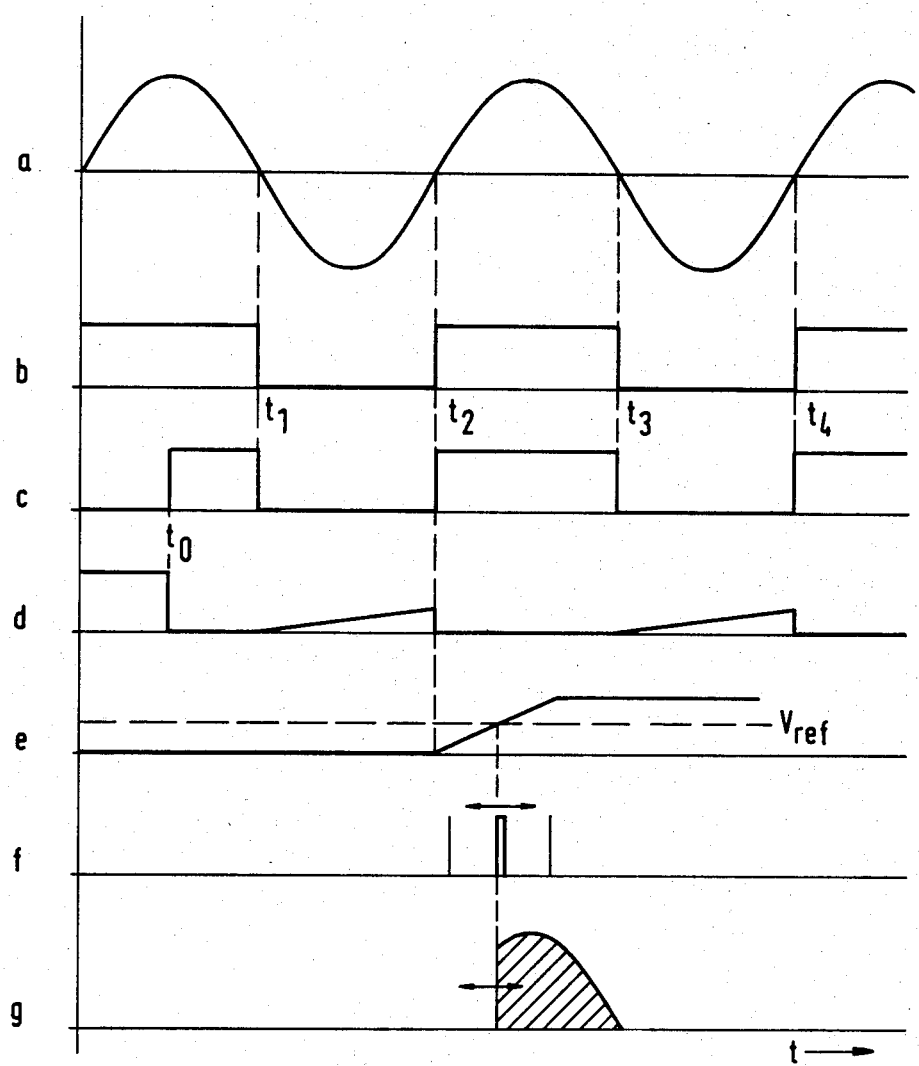

CONTROL CIRCUIT ARRANGEMENT FOR AN ELECTROMAGNETICALLY OPERATED POWER TOOL

FIELD OF THE INVENTION

The present invention relates to a control circuit arrangement for an electromagnetically operated power tool, such as an electromagnetic-tacker equipped with a solenoid for driving an armature upon which is mounted a driving blade for driving a staple or other fastening device into a workpiece.

BACKGROUND OF THE INVENTION

In such driving tools, the primary circuit is connected to an AC voltage supply, and contains in series the solenoid and a semiconductor switch that can be turned on upon the application of a trigger signal by a trigger control circuit for an adjustable part of a half-cycle of the AC voltage, whereby the trigger control circuit is activated upon the closing of an associated trigger switch. Electromagnetic-tackers of this kind are well known and are often equipped with electronic circuits for controlling the intensity of the blow such as is suggested in U.S. Pat. No. 3,267,337.

The electronic control circuit disclosed in the above-mentioned U.S. Patent includes a thyristor which, upon every driving impact, controls the power supply to the solenoid each time during a half-cycle of the supply voltage. Because the trigger switch is located in the electronic control circuit, the release, that is the opening, of the trigger switch does not prevent current flowing through the solenoid. Consequently, if the thyristor should fail and short-circuit, the solenoid remains connected to the power supply and can continuously conduct current. In such a case, the solenoid generates excessive heat and under certain circumstances is eventually destroyed. Also, as the supply voltage is not isolated by the trigger switch and is continuously applied, there is the risk of accidental firing of the thyristor due to radio frequency interference generated by universal motors, neon tubes, etc. As a result, the operator of the tacker and other persons working in the immediate vicinity are endangered.

A switch in the main circuit of an electromagnet in series with a semi-conductor switch in the form of thyristor or triac is disclosed in British Pat. Nos. 1,383,086 and 1,476,102. However, in these circuits voltage is applied to the solenoid not only during a part of a half-cycle of the supply voltage, but also continues to be applied until the armature has been pulled up. This is then followed by switching to a weaker holding current which flows either via an additional coil or in a phase cut via the main coil. The switch in the main circuit remains closed after the armature has been pulled up so that the main switch does not protect the solenoid coil in the event of a failure of the thyristor or triac.

SUMMARY OF THE INVENTION

It is an object of the present invention to provide a control circuit arrangement for an electromagnetically operated power tool such as an electromagnetic-tacker which prevents accidental firing of the thyristor and which protects the solenoid in the event of a thyristor which has failed and short-circuited.

A feature of the invention by which this object is achieved is the connection in series of the main switch, the solenoid and the semi-conductor switch, preferably a thyristor. This provides the advantage that should the thyristor fail due to a short-circuit, the power supply will be disconnected from the solenoid the moment the operator releases the main switch so preventing damage to the solenoid due to overheating, and also eliminating the possibility of accidental triggering of the thyristor due to high frequency interference from external sources.

Accordingly, therefore, there is provided by the present invention a control circuit arrangement for an electromagnetically operated power tool, comprising a primary circuit for connection to an AC voltage supply and including a solenoid and a semi-conductor switching means, in series, said semi-conductor switching means being capable of being triggered into a conducting state upon application of a trigger signal from a trigger control circuit for an adjustable part of a half-cycle of the AC supply voltage, said trigger control circuit being actuated upon closure of a main trigger switch connected thereto, and said main trigger switch being connected in series with said solenoid and said semi-conductor switching means in said primary circuit for supplying current to the solenoid.

Another feature of the invention is the provision of a delay circuit in the trigger control circuit for delaying firing of the thyristor until some time after the main switch has been closed. This has the advantage of preventing arcing and consequential damage to the switch contacts.

A further feature of the invention is the provision of an additional circuit in the trigger control circuit for preventing the thyristor from firing a second time if the main switch is held closed, this additional circuit only being reset upon release of the main switch. Thus, further firing of the thyristor and hence energisation of the solenoid cannot occur until the main switch has been released and is then reactuated.

Other objects, features and advantages of the present invention will become more fully apparent from the following detailed description of the preferred embodiment, the appended claims and the accompanying drawings.

BRIEF DESCRIPTION OF THE DRAWINGS

In the accompanying drawings:

FIG. 2 shows curve diagrams to explain the way in which the control circuit arrangement of FIG. 1 functions.

DETAILED DESCRIPTION OF THE PREFERRED EMBODIMENT

Figure 1:
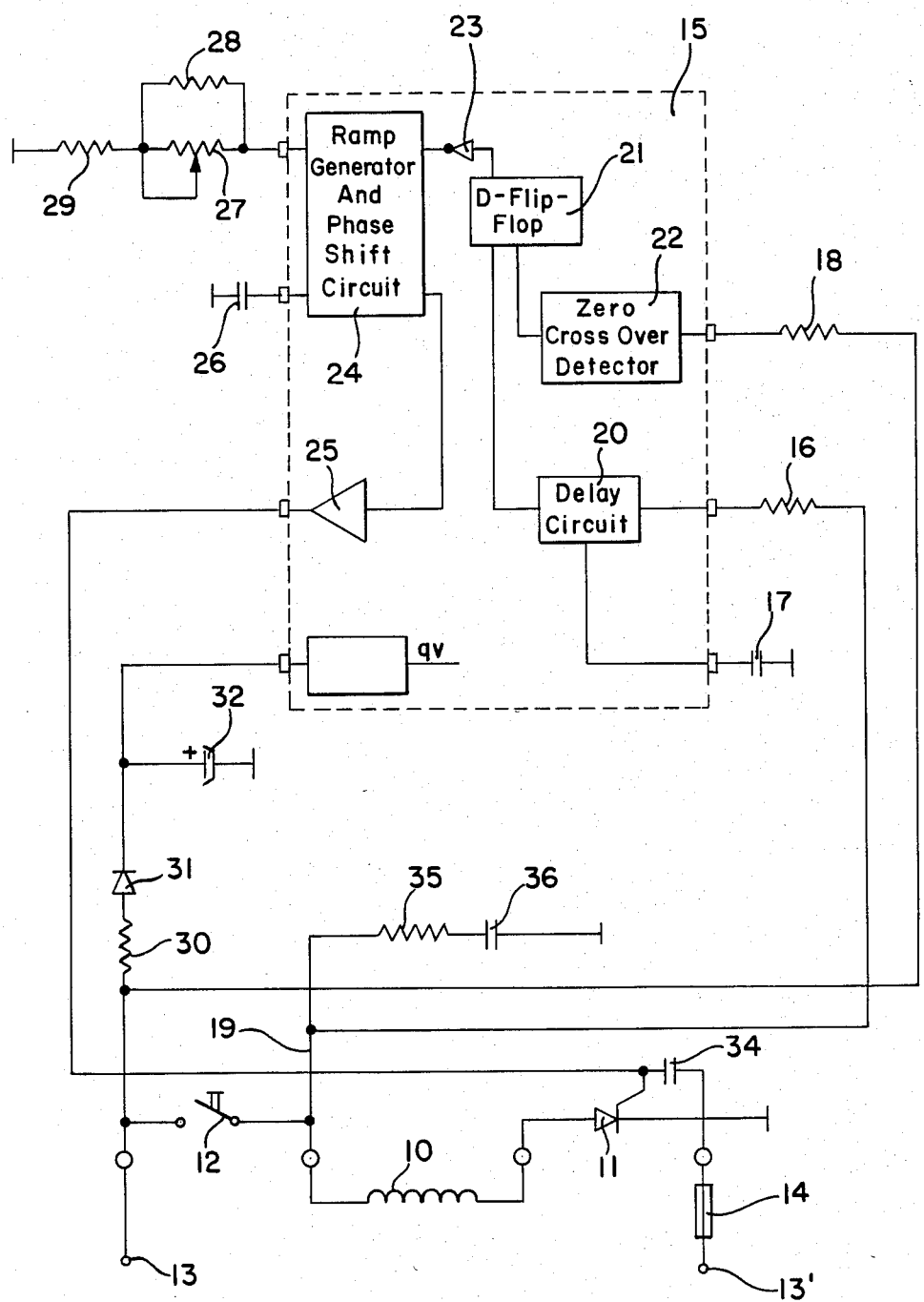
FIG. 1 is an example of a control circuit arrangement according to the invention.

FIG. 1 shows the preferred embodiment of the control circuit arrangement of the present invention which has a primary circuit incorporating a solenoid 10 connected in series with a thyristor 11 and a main trigger switch 12. The terminals 13 and 13' are provided for connection to an AC power source, suitably the mains power supply. A fuse 14 is also incorporated in the primary circuit. Between the control electrode and the cathode of the thyristor 11 is a condenser 34 for suppressing static interference. A series circuit consisting of a resistance 35 and a condenser 36 bridges the solenoid 10 and the thyristor 11 to protect the thyristor 11.

The thyristor 11 is controlled by a control circuit 15 which is preferably an integrated circuit containing a plurality of electronic circuit components formed therein. The integrated circuit 15 includes a delay circuit 20 connected to the main trigger switch 12 via a resistor 16, the delay time of the delay circuit 20 being adjustable by means of a capacitor 17. The output of the delay circuit 20 is connected as an input signal to a D-flip-flop 21, another input signal to which is supplied from the output of a zero crossing detector 22, the input of which is connected to the main power voltage via a resistor 18. The output of the D-flip-flop 21 is connected as an input signal to a ramp generator and phase shift circuit 24 via an inverter 23.

The ramp generated by the ramp generator of the circuit 24 can be adjusted by adjusting the value of a capacitor 26, while the firing angle of the phase shift circuit, which includes a single shot circuit, can be adjusted by means of a potentiometer 27, which ultimately determines the amount of energy which will be passed by the thyristor 11, once triggered. Two resistances 28, 29 determine the adjustment range of the potentiometer. The output signal of the ramp generator and phase shift circuit 24 is connected as an input to a trigger amplifier circuit 25 for amplifying the trigger signal to be applied to the gate of the thyristor 11. To generate the required DC supply voltage for the components of the integrated circuit 15, there is provided a rectifier diode 31 with a limiting resistor 30 connected in front and a charge condenser 32 connected behind.

The operation of the control circuit arrangement of FIG. 1 will now be described with simultaneous reference to FIG. 2.

In FIG. 2, line a illustrates the mains supply voltage applied across the connections 13, 13', with a frequency of, for example, 50 Hz and an effective voltage of 220 v. The peak value then in each case is ±314 v. The zero crossovers have a time interval of 10 ms for the frequency of 50 Hz. The zero crossovers at points in time $t_1$, $t_2$, $t_3$, etc., are marked by the output voltage of the zero-crossover detector 22, illustrated in line b. During the closing of the trigger switch 12 at time $t_o$ (see line c in FIG. 2), there is at first no current flowing via the solenoid 10 because the thyristor 11 has not triggered; however, the delay circuit 20 establishes the presence of a voltage on line 19 via the sensor resistor 16. The voltage applied to the input of the delay circuit 20 is illustrated in line c in FIG. 2. The square-wave voltage materializes at the input of the delay circuit 20 due to the limitation of the AC mains voltage by means of the resistor 16 and a semi-conductor component (not illustrated). With the exception of the starting time $t_o$ during the closing of switch 12, the voltage curve on line c corresponds to the curve on line b.

Delay circuit 20, after the expiration of a fixed delay, which is marked by the rise of the voltage on line d at a moment which in terms of time roughly coincides with $t_1$, supplies a signal to the input of the D-flip-flop 21 enabling the output of the flip-flop to go to a low voltage (L) (not illustrated) when the zero-crossing detector 22 at time $t_2$ supplies a signal which indicates a zero crossover going in the positive direction. Thus, when the delay has expired and a zero crossover detected, the D-flip-flop 21 supplies a signal via the inverter 23 to the ramp generator in circuit 24 which triggers the start and the rise of the ramp voltage illustrated on line e. When the ramp voltage reaches a reference voltage $V_{ref}$, which is adjusted by the potentiometer 27, the single shot circuit of the ramp generator and phase shift circuit 24 supplies a trigger signal via the amplifier 25 to the gate of the thyristor 11, as a result of which the thyristor conducts and energises the solenoid 10. The trigger signal is illustrated on line f. It can be shifted in its phase position by altering the reference voltage $V_{ref}$ approximately within the limits illustrated, this resulting in the positive half-cycle portion, which is illustrated on line g and which is applied to the solenoid, being altered. In this way output regulation is obtained.

As long as the trigger switch 12 is closed, the output of the delay circuit 20 remains low so that the flip-flop 21 remains blocked and gives no further signals to the ramp generator in the circuit 24. As a result, a second or further firing of the thyristor 11 is prevented until the trigger switch 12 has been released and then subsequently closed again.

Thus, it can be seen that the main switch 12, in the arrangement of the present invention, serves a plurality of functions in that, it firstly acts as a main switch to close the primary current circuit containing the solenoid 10, secondly it acts as a signal switch for actuating the control circuitry to generate a delayed trigger pulse for the thyristor 11 to enable energisation of the solenoid 10, and thirdly it serves to permit isolation of the solenoid 10 from the power supply, in the event of failure and short-circuiting of the thyristor 11, by simply releasing, that is opening, the main switch 12. Further, since the main switch 12 is connected in the main power supply circuit for the solenoid 10, the likelihood of accidental firing of the thyristor 11 by radio frequency interference is minimised since the main switch 12 is normally open thereby isolating the solenoid 10 from the main power supply until the main switch 12 is closed by the operator to fire the electromagnetictacker.

The incorporation of a delay circuit 20 in the control circuit 15 has a further advantage in that since there is a time delay between the closure of the main switch and the triggering of the thyristor, arcing at the contacts of the main switch 12 is avoided and for this reason the main switch 12 can be used to open and close a circuit which can draw as much as 30 amps without damage to the switch contacts.

Although the circuit arrangement of the present invention has been primarily directed to electromagnetic-tackers and the like fastener driving tools, it would be equally applicable as an electronic control circuit to other tools, such as punches or firing mechanisms, which may be driven pneumatically or hydraulically, in which case the solenoid would be associated with a valve rather than an armature carrying a driving blade.

The above described embodiments, of course, are not to be construed as limiting the breadth of the present invention. Modifications, and other alternative constructions, will be apparent which are within the spirit and scope of the invention as defined in the appended claims.

What is claimed is:

1. A control circuit arrangement for an electromagnetically operated power tool, comprising:
   a primary circuit for connection to an AC voltage supply and including a solenoid and a thyristor in series;
   said thyristor being capable of being triggered into a conducting state upon application of a trigger signal from a trigger control circuit for an adjustable part of a half-cycle of the AC supply voltage;
   said trigger control circuit being actuated upon closure of a main trigger switch connected thereto;

said main trigger switch being connected in series with said solenoid and said thyristor in said primary circuit for supplying current to the solenoid;

a delay circuit in said trigger control circuit for delaying the generation of a trigger signal for a predetermined period after closure of the main switch so as to delay firing of the thyristor to prevent arcing at the contacts of the main trigger switch; and said trigger control circuit including a ramp generator and phase shift circuit for generating a trigger signal for enabling energisation of the solenoid in response to actuation of the main trigger switch.

2. The control circuit arrangement as claimed in claim 1, wherein the ramp generator circuit is adjustable by means of a capacitor, and wherein the firing angle of the phase shift circuit is adjusted by means of a potentiometer thereby predetermining the amount of energy which is passed by the thyristor for energising the solenoid.

3. A control circuit arrangement for an electromagnetically operated power tool, comprising:

a primary circuit for connection to AC main power voltage and including a solenoid and a thyristor in series;

said thyristor being capable of being triggered into a conducting state upon application of a trigger signal from a trigger control circuit;

said trigger control circuit being actuated upon closure of a main trigger switch connected thereto;

said main trigger switch being connected in series with said solenoid and said thyristor in said primary circuit for supplying current to the solenoid;

said trigger control circuit including a delay circuit for delaying the generation of a trigger signal for a predetermined period after closure of the main switch so as to delay firing of the thyristor to prevent arcing at the contacts of the main trigger switch;

safety circuit means provided in the trigger control circuit to prevent the generation of a second trigger pulse for as long as the main trigger switch is held closed, said safety circuit means being reset upon release of the main trigger switch;

said safety circuit means comprising a D-flip-flop one input of which is provided by the delay circuit associated with the main trigger switch and a further input of which is provided by a zero crossing detector connected to the main power voltage; and said trigger control circuit including a ramp generator and phase shift circuit for generating a trigger signal for enabling energisation of the solenoid in response to actuation of the main trigger switch.

4. The control circuit arrangement as claimed in claim 3, wherein the ramp generated by the ramp generator circuit is adjustable by means of a capacitor, and wherein the firing angle of the phase shift circuit is adjusted by means of a potentiometer thereby predetermining the amount of energy which is passed by the thyristor for energizing the solenoid.

* * * * *